United States Patent [19]

Johnson

[11] Patent Number: 4,571,608
[45] Date of Patent: Feb. 18, 1986

[54] INTEGRATED VOLTAGE-ISOLATION POWER SUPPLY

[75] Inventor: Robert G. Johnson, Minnetonka, Minn.

[73] Assignee: Honeywell Inc., Minneapolis, Minn.

[21] Appl. No.: 455,147

[22] Filed: Jan. 3, 1983

[51] Int. Cl.[4] ............................................. H01L 23/56
[52] U.S. Cl. ........................................ 357/28; 357/55; 307/310; 29/573
[58] Field of Search ...................... 357/25, 28, 49, 51, 357/4, 55, 26; 307/310; 338/22–25; 29/573

[56] References Cited

U.S. PATENT DOCUMENTS

| | | |
|---|---|---|
| 2,700,829 | 2/1955 | Statsinger . |
| 3,359,462 | 12/1967 | Schutze et al. ................ 357/49 |
| 3,534,809 | 10/1970 | Charitat et al. . |
| 3,546,434 | 12/1970 | Apel . |
| 3,679,941 | 7/1972 | LaCombe et al. ................ 357/49 |
| 3,715,288 | 2/1973 | Risgin ................ 357/28 |
| 3,758,830 | 9/1973 | Jackson ................ 357/28 |
| 3,801,949 | 4/1974 | Larrabee ................ 357/28 |
| 4,207,481 | 6/1980 | Dobkin ................ 357/28 |
| 4,238,762 | 12/1980 | McWilliams et al. ................ 357/49 |
| 4,472,239 | 9/1984 | Johnson et al. ................ 357/69 |

OTHER PUBLICATIONS

*Circuits, Devices, and Systems: A First Course in Electrical Engineering,* 3rd Edition, by R. J. Smith (1976), pp. 336, 337.

Primary Examiner—Andrew J. James
Assistant Examiner—Mark Prenty
Attorney, Agent, or Firm—John P. Sumner

[57] ABSTRACT

Disclosed is an integrated voltage-isolation power supply comprising a thin film heater, a thin film thermocouple, and a thin film of dielectric. A semiconductor body supports a portion of the thin film of dielectric out of contact with the body. The thin film of dielectric out of contact with the body supports at least a major portion of the heater and the thermocouple. The thermocouple has a hot junction disposed adjacent to the heater but out of electrical contact with the heater.

30 Claims, 2 Drawing Figures

INTEGRATED VOLTAGE-ISOLATION POWER SUPPLY

CROSS-REFERENCE TO RELATED APPLICATIONS

Reference is made to the following copending patent applications which are assigned to the same assignee as the present application:

"Semiconductor Device" by R. G. Johnson and R. E. Higashi, filed Oct. 9, 1981, Ser. No. 310,345 and now abandoned.

"Semiconductor Device" by R. G. Johnson and R. E. Higashi, filed Sept. 30, 1982, Ser. No. 431,851.

BACKGROUND OF THE INVENTION

A need exists to transmit a small amount of power from one area on an integrated circuit chip to another electrically isolated area on the chip to operate, for example, silicon electronic components. The power must be transmitted across a barrier that can withstand hundreds of volts.

SUMMARY OF THE INVENTION

The present invention is an integrated voltage-isolation power supply comprising a thin film heater, a thin film thermocouple, and a thin film of dielectric. A semiconductor body supports a portion of the thin film of dielectric out of contact with the body. The thin film of dielectric out of contact with the body supports at least a major portion of the heater and the thermocouple. The thermocouple has a hot junction disposed adjacent to the heater but out of electrical contact with the heater.

DESCRIPTION OF THE PREFERRED EMBODIMENTS

Figure 1:
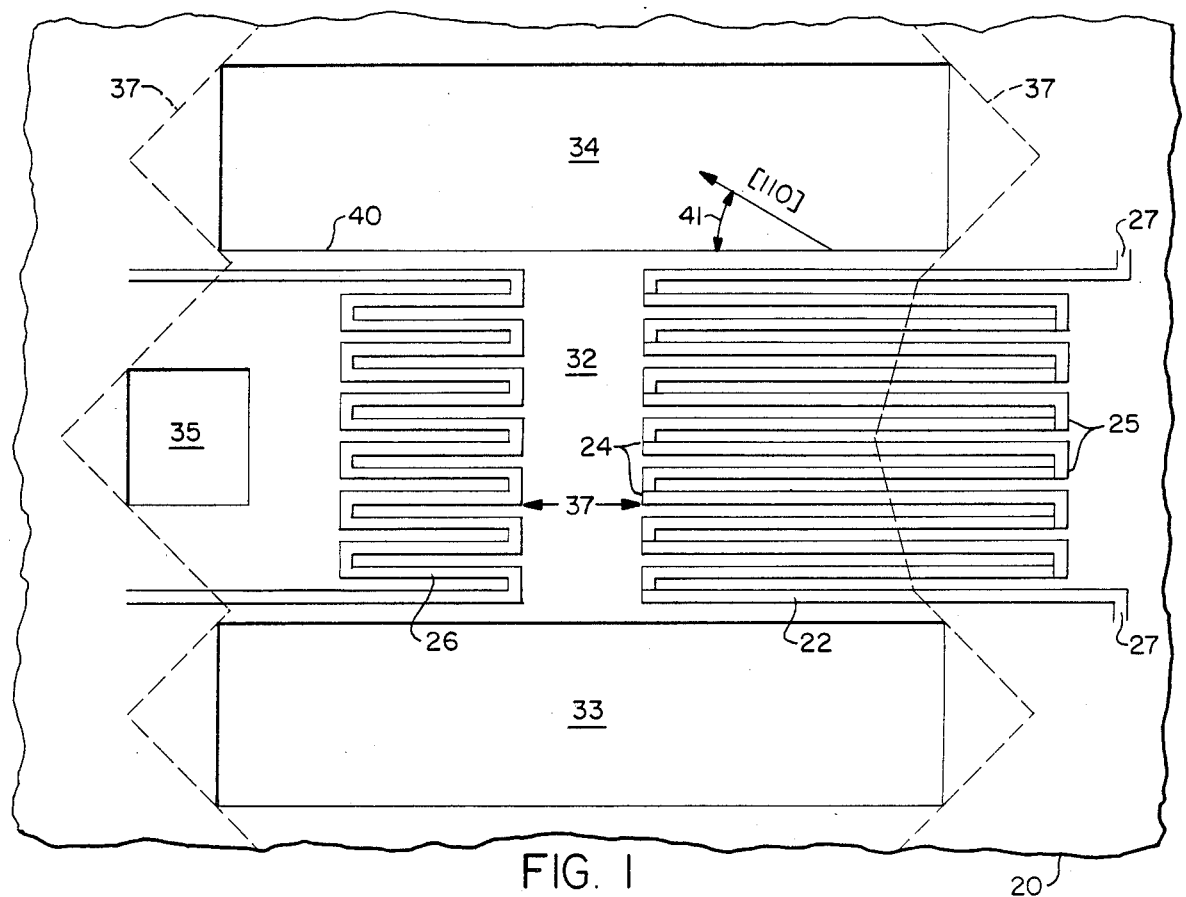
FIGS. 1 and 2 schematically illustrate a preferred embodiment of the present invention.
Figure 2:
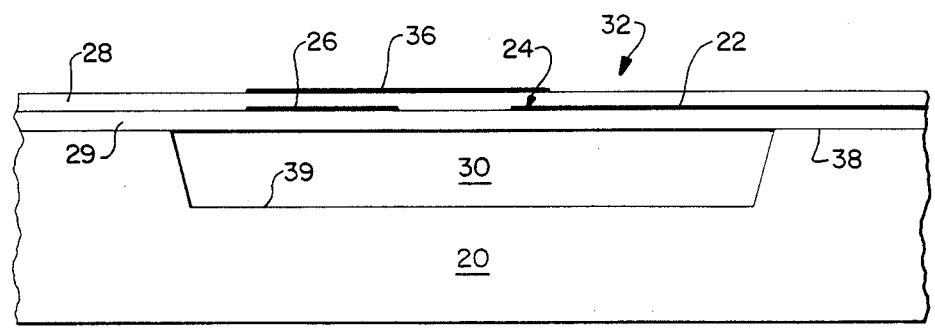

FIGS. 1 and 2 illustrate a preferred structure that will transmit power from one area on a chip to another electrically isolated area on the chip. The structure shown comprises a semiconductor body 20, preferably silicon, chosen because of its adaptability to precision etching techniques and ease of electronic chip producibility. The preferred embodiment includes a thin film heater comprising a resistor grid 26 preferably fabricated of nickel-iron, herein sometimes referred to as permalloy, having a preferred composition of 80 percent nickel and 20 percent iron. The present structure further comprises a thin film grid 22 of thermocouple pairs connected in series, the embodiment shown comprising seven pairs of thermocouples having hot junctions 24 and cold junctions 25.

In the embodiment disclosed, heater 26 and thermocouple 22 are encapsulated in thin film dielectric shown as layers 28 and 29. These dielectric layers, and at least a substantial portion of elements 22 and 26, form a thin film member 32 suspended over a depression 30 etched into semiconductor body 20. Together with dielectric layers 28 and 29, depression 30 provides substantial thermal isolation between heater 26 and semiconductor body 20 and between hot junctions 24 and cold junctions 25.

The structure shown enables temperatures of 100 to 200 degrees centigrade to be produced on member 32 with a power input of only a few milliwats. If for some applications one structure such as shown in FIG. 1 does not provide an adequate voltage supply across terminals 27, more than one such structure may be used and still not excessively heat silicon chip 20. Although the embodiment shown comprises seven thermocouple junctions, a single bridge or member 32 can accommodate ten or more junctions. Member 32, as shown in FIG. 1, occupies an area of approximately 0.010 inch by 0.020 inch. Several such bridges or members may be placed on a 0.100 inch by 0.100 inch chip and still occupy only a minor fraction of the chip area.

Thermocouple materials for thermocouple pairs 22 may comprise NiCr/CuNi which yield a voltage of 6.3 millivolts for a 0–100 degree centigrade difference between hot and cold junctions 24 and 25. Accordingly, isolated supply of voltages in the neighborhood of 0.4 to 0.6 volt may be achieved with the structure of FIG. 1, and several such structures can easily be used on one silicon chip.

The total combined thickness of dielectric layers 28 and 29 is typically 0.5 to 1.0 micron, the dielectric preferably being silicon nitride within which is laminated permalloy resistor element 26, typically on the order of 800 angstroms thick, and the pairs of thermocouples 22.

Opening 35 reduces thermal conduction along bridge 32 and thereby increases the efficiency of element 26. A thermally conductive layer 36 may be deposited on the center of member 32 over thin film heater 26 and junctions 24 in order to increase the thermal conductivity from heater 26 to hot junctions 24. Layer 36 is preferably of a material which is not only a conductor of heat but is also an electrical insulator. An example of a suitable material for layer 36 is sapphire.

Since member 32 is very thin and has a low specific thermal conductivity, its thermal time constant is very small, being on the order of five milliseconds. Consequently, the isolated circuit coupled across output terminals 27 may be powered at AC frequencies as well as at DC. Voltage isolation zone 37 along member 32 between heater 26 and hot junctions 24 is shown in the present embodiment to be 0.002 inch wide, which provides an insulation of up to 700 volts in air at normal pressures.

For some applications, performance of the present structure may be affected by air flow over member 32; for such applications no-flow packaging to prevent air flow over member 32 may be desirable. Further, ambient temperature may affect performance for some applications and, in such instances, it may be desirable to thermostat semiconductor body 20 to a temperature above the highest expected operating temperature.

The preferred process of fabricating the present apparatus comprises providing a (100) silicon wafer 20 having a (100) surface 38 which receives a layer 29 of silicon nitride. Layer 29 is typically 4000 angstroms thick and is typically deposited by standard sputtering techniques in a low pressure gas discharge. Next, the materials comprising elements 22 and 26 are deposited on silicon nitride layer 29 by sputtering to a thickness of approximately 800 angstroms.

Using a suitable photomask, a photoresist, and a suitable etchant, elements 22 and 26 are deliniated. A second layer 28 of silicon nitride, typically 4000 angstroms thick, is then sputter deposited to provide complete step coverage of elements 22 and 26. Openings 33, 34, and 35 are then etched through nitride layers 28 and 29 to silicon surface 38 in order to deliniate member 32. The relative sizes of openings 33, 34, and 35 are largely a matter of design choice.

Finally, anisotropic etchant that does not attack the silicon nitride is used to etch out the silicon in a controlled manner from beneath member 32 (KOH plus isopropyl alcohol is a suitable etchant). The sloping sides of depression 30 are bounded by (111) and other crystal surfaces that are resistive to the etchant, and depression bottom 39, a (100) surface which is much less resistant to the etchant, is located a specified distance (e.g., 0.004 inch) from member 32, typically by adjusting the duration of the etch.

The predetermined configuration of member 32, e.g., typically a straight edge such as 40, is oriented at a nonzero angle 41 to the [110] axis of the silicon. By making angle 41 substantially 45°, member 32 will be undercut in a minimum amount of time. Members such as 32 are substantially impossible to make with member edges such as 40 oriented substantially with the [110] direction. This is because an anisotropic etch will not appreciably undercut at inside corners or at the (111) crystal planes exposed along the edges of the member if the edges of the member are oriented with the [110] direction.

Dashed lines 37 indicate the approximate shape of the contact line of support between the silicon nitride and semiconductor chip 20 near the ends of member 32.

The apparatus shown has both heater 26 and thermocouple pairs 22 located on the same member 32. It is also possible to place a heater such as 26 on a first member suspended over depression 30 and the thermocouple pairs 22 on a second member suspended over the depression.

The embodiments of the invention in which an exclusive property or right is claimed are defined as follows:

1. An integrated voltage-isolation power supply, comprising:
    a thin film heater;
    a thin film thermocouple, the thermocouple comprising a hot junction and a cold junction;
    a thin film of dielectric; and
    a semiconductor body for supporting a portion of the thin film of dielectric out of contact with the body, the thin film of dielectric out of contact with the body supporting the heater and the hot junction of the thermocouple, the hot junction being disposed adjacent to the heater but out of electrical contact with the heater, the cold junction being substantially heat sunk to the semiconductor body.

2. The apparatus of claim 1 wherein:
    the semiconductor body has a depression therein; and
    the thin film of dielectric supports the at least a major portion of the heater and the hot junction of the thermocouple over the depression.

3. The apparatus of claim 2 wherein the heater comprises a thin film of permalloy.

4. The apparatus of claim 3 wherein the semiconductor body comprises silicon having a (100) surface and a [110] axis, the thin film of dielectric being attached to the (100) surface, the portion of the thin film of dielectric which is out of contact with the body forming a thin film member oriented at a nonzero angle to the [110] axis.

5. The apparatus of claim 4 wherein the nonzero angle is substantially 45°.

6. The apparatus of claim 5 wherein the dielectric comprises silicon nitride.

7. The apparatus of claim 6 wherein the thin film of dielectric encapsulates the heater and the thermocouple.

8. The apparatus of claim 1 wherein the heater comprises a thin film of permalloy.

9. The apparatus of claim 8 wherein the semiconductor body comprises silicon having a (100) surface and a [110] axis, the thin film of dielectric being attached to the (100) surface, the portion of the thin film of dielectric which is out of contact with the body forming a thin film member oriented at a nonzero angle to the [110] axis.

10. The apparatus of claim 9 wherein the nonzero angle is substantially 45°.

11. The apparatus of claim 10 wherein the dielectric comprises silicon nitride.

12. The apparatus of claim 1 wherein the semiconductor body comprises silicon having a (100) surface and a [110] axis, the thin film of dielectric being attached to the (100) surface, the portion of the thin film of dielectric which is out of contact with the body forming a thin film member oriented at a nonzero angle to the [110] axis.

13. The apparatus of claim 12 wherein the nonzero angle is substantially 45°.

14. The apparatus of claim 13 wherein the dielectric comprises silicon nitride.

15. The apparatus of claim 12 wherein the dielectric comprises silicon nitride.

16. An integrated voltage-isolation power supply, comprising:
    a thin film heater encapsulated in thin film dielectric;
    a thin film thermocouple encapsulated in thin film dielectric, the thermocouple comprising a hot junction and a cold junction, the hot junction being disposed adjacent to the heater but out of electrical contact with the heater;
    a semiconductor body with a depression therein; and
    the encapsulated heater and thermocouple hot junction forming at least one thin film member bridged across the depression so that at least a major portion of the heater and the thermocouple hot junction are supported by the member and are out of contact with the semiconductor body, the thermocouple cold junction being substantially heat sunk to the semiconductor body.

17. The apparatus of claim 16 wherein the heater comprises a thin film of permalloy.

18. The apparatus of claim 17 wherein the semiconductor body comprises silicon having a (100) surface and a [110] axis, the at least one thin film member bridged across the depression being attached to the (100) surface and being oriented at a nonzero angle to the [110] axis.

19. The apparatus of claim 18 wherein the nonzero angle is substantially 45°.

20. The apparatus of claim 19 wherein the dielectric comprises silicon nitride.

21. The apparatus of claim 16 wherein the semiconductor body comprises silicon having a (100) surface and a [110] axis, the at least one thin film member bridged across the depression being attached to the (100) surface and being oriented at a nonzero angle to the [110] axis.

22. The apparatus of claim 21 wherein the nonzero angle is substantially 45°.

23. The apparatus of claim 22 wherein the dielectric comprises silicon nitride.

24. The apparatus of claim 21 wherein the dielectric comprises silicon nitride.

25. The apparatus of claim 1 wherein the thin film of dielectric comprises a thin film of heat conductor for conducting heat between the thin film heater and the hot junction.

26. The apparatus of claim 25 wherein the thin film of heat conductor is an electrical insulator.

27. The apparatus of claim 26 wherein the thin film of heat conductor comprises sapphire.

28. The apparatus of claim 16 wherein the at least one thin film member comprises a thin film of heat conductor for conducting heat between the thin film heater and the hot junction.

29. The apparatus of claim 28 wherein the thin film of heat conductor is an electrical insulator.

30. The apparatus of claim 29 wherein the thin film of heat conductor comprises sapphire.

* * * * *